United States Patent [19]

Tanagawa et al.

[11] Patent Number: 4,788,454
[45] Date of Patent: Nov. 29, 1988

[54] POWER-ON RESET CIRCUIT

[75] Inventors: Kouji Tanagawa, Tokyo; Tomoaki Yoshida, Minatoku, both of Japan

[73] Assignee: Oki Electric Industry Co., Ltd., Tokyo, Japan

[21] Appl. No.: 74,251

[22] Filed: Jul. 16, 1987

[30] Foreign Application Priority Data

Jul. 21, 1986 [JP] Japan .................................. 61-171374

[51] Int. Cl.⁴ ...................... H03K 3/01; H03K 5/153; H03K 17/16; H03K 19/017
[52] U.S. Cl. ............................ 307/296 R; 307/200 A; 307/362; 307/443; 307/448
[58] Field of Search ........... 307/362, 475, 443, 200 A, 307/350, 272 R, 448, 296.5

[56] References Cited

U.S. PATENT DOCUMENTS 4,103,187  7/1978  Imamura ........................ 307/296 R
4,366,560  12/1982  McDermott et al. .............. 307/362

FOREIGN PATENT DOCUMENTS 114326  7/1975  Fed. Rep. of Germany .
3336640  4/1984  Fed. Rep. of Germany .

Primary Examiner—John Zazworsky
Assistant Examiner—M. Wambach
Attorney, Agent, or Firm—Spencer & Frank

[57] ABSTRACT

A reset circuit for a logic circuit comprises a MOS transistor having a gate coupled to a power supply, a source receiving a reset input and a drain whose potential is high when the reset input is high and the power supply voltage drops below a predetermined threshold, a flip-flop connected to be set when the drain of the MOS transistor is high and reset when the reset input is low, and a circuit producing a reset output when the flip-flop is in the set state, the reset output being applied to the logic circuit.

16 Claims, 1 Drawing Sheet

POWER-ON RESET CIRCUIT

BACKGROUND OF THE INVENTION

The present invention relates to a reset circuit for detecting a voltage drop of a power supply for a logic circuit such as a microcomputer and to prevent unstable operation of the logic circuit or a system in which the logic circuit is applied.

Generally, in a system in which a logic circuit such as a microcomputer is applied, an erroneous operation could occur when the power supply voltage drops. Such an erroneous operation is especially problematical where the logic circuit is applied in an area such as an automobile controller, and to a machine tool controller where high reliability is required. To prevent erroneous operation, a reset circuit is provided to detect the voltage drop and to reset the logic circuit to a safe condition.

A conventional reset circuit of this kind comprises a circuit for detecting a voltage drop in the power supply and resets the logic circuit responsive to the voltage detecting circuit. The voltage detecting circuit can be formed of a special IC (integrated circuit), or of a combination of a reference diode, an operational amplifier or other discrete circuit elements.

However, the above reset circuit is complicated in configuration, expensive and occupies a large space. Moreover, the detection voltage is fixed. For instance if the circuit is fabricated for operation with a 5 V power supply, it cannot be used for operation with a power supply having another voltage value such as 4 V.

Moreover, when the power supply voltage repeatedly drops and is restored a number of times in a short time, due for instance to chattering that occurs when the power supply is connected or the power supply switch is closed, the logic circuit under control of the reset circuit will repeatedly reset and operate. As a result, the operation of the system in which the logic circuit is applied is unstable. To prevent repetitive resetting, a capacitor with a large capacitance such as several microfarads, can be connected in the power supply circuit. But such a large-capacitance capacitor cannot be built in an IC and increases the space required and the cost.

SUMMARY OF THE INVENTION

An object of the invention is to provide a reset circuit that can be manufactured at a reduced cost, occupies a smaller space than conventional circuits, enables adjustment of the detection voltage, and ensures stable operation of the logic circuit.

According to the invention there is provided a reset circuit for a logic circuit comprising:

a MOS transistor having a gate coupled to a power supply, a source receiving a reset input and a drain whose potential is high when the reset input is high and the power supply voltage drops below a predetermined threshold, a flip-flop connected to be set when the drain of the MOS transistor is high and reset when the reset input is low, and means producing a reset output when the flip-flop is in the set state, said reset output being applied to the logic circuit.

The MOS transistor detects the power supply voltage drop using the voltage level of the reset input as a reference. By varying the voltage level of the reset input, the detection value (threshold) against the power supply voltage drop can be changed. The flip-flop holds the reset output supplied to the logic circuit and stabilizes the operation of the logic circuit. The MOS transistor and the flip-flop can be formed of a simple structure, and in a small size, so that they can be built as an integral part with the logic circuit for which they are provided.

DETAILED DESCRIPTION OF THE EMBODIMENT

Figure 1:
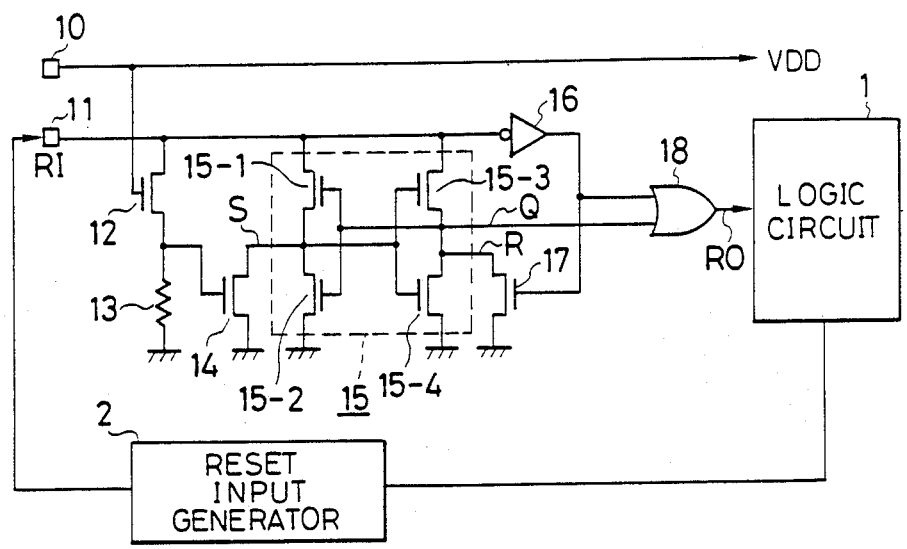
FIG. 1 is a circuit diagram showing an embodiment of the invention.

FIG. 1 is a circuit diagram showing a reset circuit of an embodiment of the invention.

The reset circuit controls setting and resetting of the logic circuit 1 such as a microcomputer. The reset circuit comprises a power supply terminal 10 for connection with a power supply $V_{DD}$ whose voltage drop needs to be monitored, an input terminal 11 for receiving a reset input RI, p-channel MOS (metal-oxide-semiconductor) transistor (PMOS) 12, a resistor 13, an n-channel MOS transistor (NMOS) 14, a set-reset flip-flop (RS-FF) 15, an inverter 16, an NMOS 17 and a two-input OR gate 18 for producing a reset output RO.

The PMOS transistor 12 detects a drop of the power supply voltage VDD (that is normally at 5V), using the voltage level of the reset input RI minus the threshold voltage VT of the PMOS 12 as a reference. The gate of the PMOS 12 is connected to the power supply terminal 10, the source of the PMOS 12 is connected to the input terminal 11, and the drain of the PMOS 12 is connected through a resistor 13 to ground, and to the gate of the NMOS transistor 14. The drain of the NMOS 14 is connected to a set input terminal S of the flip-flop RS-FF 18 and the source of the NMOS 14 is connected to ground.

The RS-FF 15 holds the detection output of the PMOS 12, and has, apart from the set input terminal S, a reset input terminal R and an output terminal Q. The RS-FF 15 comprises PMOS's 15-1, 15-3 and NMOS's 15-2, 15-4. The PMOS 15-1 and the NMOS 15-2 are connected in series between the input terminal 11 and ground. The PMOS 15-3 and the NMOS 15-4 are connected in series between the input terminal 11 and ground. The gates of the PMOS 15-1 and the NMOS 15-2 are connected to the output terminal Q and the reset input terminal. The gates of the PMOS 15-3 and the NMOS 15-4 are connected to the set input terminal S.

The input terminal 11 is connected to the input of the inverter 16, whose output is connected to one input of the OR gate 18 and to the gate of the NMOS 17. The drain of the NMOS 17 is connected to the reset input terminal R and the output terminal Q of the RB-FF 15. The source of the NMOS 17 is connected to ground. The output Q of the RS-FF 15 is connected to another input of the OR gate 18, whose output is connected to the logic circuit 1.

Figure 2:
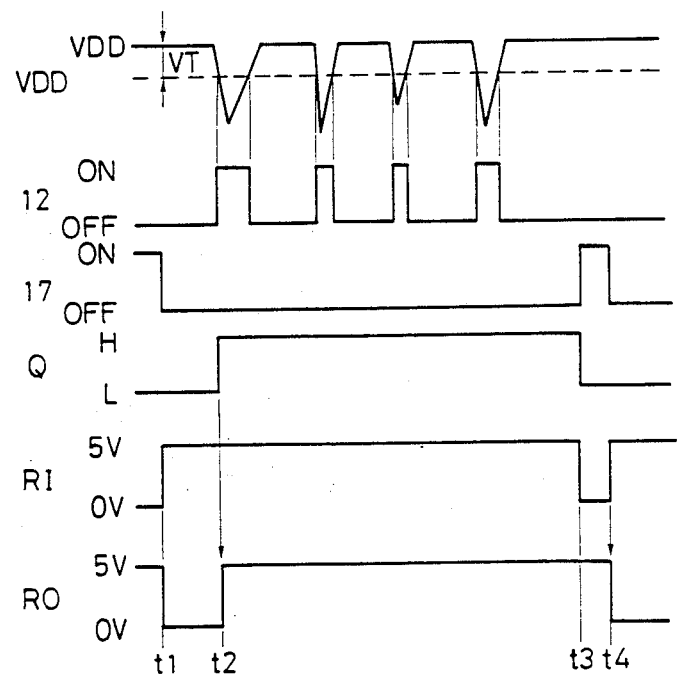
FIG. 2 is a waveform diagram showing operation of the circuit of FIG. 1.

FIG. 2 shows the operation of the logic circuit of FIG. 1. It is assumed that the power supply voltage VDD repeatedly drops and is restored a number of times during a period between t2 and t3.

The period before time t1 is a period for resetting the logic circuit 1, during which a reset input RI of a low level (=OV) is applied from outside to the input terminal 11. The reset input RI is inverted by the inverter 16 and is applied to the OR gate 18, which therefore outputs a high-level (5V) reeet output RO. The reset output RO is applied to the logic circuit 1 to reset the circuit elements in the logic circuit 1.

At time t1, the reset input RI is terminated and raised to a high level. Then, the output (reset release signal) of the inverter 16 goes low and the output (reset output) RO of the OR gate 18 goes low. The logic circuit 1 starts normal operation.

During operation of the logic circuit 1, if the power supply voltage VDD drops, at time t2, below a reference Vref (=4.4 V) which is equal to the power supply voltage rating VDD of 5 V minus the threshold voltage VT (=0.6 V) of the PMOS 12, the PMOS 12 is turned on and a potential difference is created across the resistor 13. By virtue of this potential difference, the NMOS 14 is turned on. The set input terminal S of the RS-FF 15 is lowered to ground potential and the RS-FF 15 is set. The output Q of the RS-FF 15 goes high. The output RO of the OR gate 18 goes high and resets the logic circuit 1. This state is held at the RS-FF 15: that is even if the power supply voltage VDD is restored to 5 V again, the reset output RO is maintained high, and the logic circuit 1 is kept reset. Accordingly, even if the power supply voltage VDD stored a number of times the logic circuit 1 is kept reset. Thus, the unstable operation which occurs in the conventional system can be avoided.

To restart a normal operation, the reset input RI is made low, at time t3, for example. Then, the output of the inverter 16 is made high and the NMOS 17 is turned on. The reset input R to the RS-FF 15 goes low and the RS-FF 15 is therefore reset. Subsequently, at time t4, the reset input RI is made high again, and the output of the inverter 16 goes low. The NMOS 17 is turned off and the output RO of the OR gate 18 goes low. The resetting of the logic circuit 1 is terminated, and normal operation of the logic circuit 1 is resumed. When the RS-FF 15 is formed of typical circuit components the logic circuit can operate normally if its power supply from the reset input terminal 11 is not lower than 3 V. Accordingly, proper operation of the reset circuit is ensured even where the reset input RI and the power supply are of a lower voltage level. In other words, the same reset circuit can be used without modification to operate with a logic circuit whose power supply voltage is not less than about 3 V.

The reset input RI can be made low when it is found that the logic circuit 1 does not produce a signal, over a predetermined period, indicating that it is operating for this purpose, a circuit 2 can be provided to monitor the operation of the logic circuit 1 to control production of the reset input RI.

Alternatively, a circuit for producing the reset input RI at a regular interval can be used.

As has been described, according to the above embodiment, when the power supply voltage VDD falls from the rating (=5 V) below the reference Vref (=4.4 V), the voltage drop is detected by the PMOS 12, and the RS-FF 15 is set, and the reset output RO is maintained high. Unstable operation of the logic circuit can be prevented even if the power supply voltage drops repeatedly. The detecting MOS transistor, the flip-flop and the rest of the circuit elements can be formed in an IC. No discrete circuit components such as a large-capacitance capacitor are needed. The circuit is simple and can be manufactured at a low cost. The space occupied by the circuit can be reduced. The reset circuit can therefore be formed as an integral part of the logic circuit 1, or built in the logic circuit.

Moreover, the reset circuit can be used, fed with a power supply voltage other than 5 V. For instance, when the power supply voltage VDD is made at 4 V, the reset input voltage level can also be made at 4 V. The result is that the voltage drop detection value will be 3.4 V if the threshold voltage VT of the PMOS 12 is 0.6 V.

The reset circuit of the invention can therefore be used in an area such as automobile control, machine tool control, robot control, or IC card logic where a high reliability and security are required.

Various modifications can be made. For instance, the PMOS 12 can be replaced by an NMOS, the RS-FF 15 can be replaced by another type of flip-flop or any other circuit capable of holding a "reset" state. The transistors and the gates at the inputs and the output of the flip-flop can be modified in line with the modification to the flip-flop.

What is claimed is:

1. A reset circuit for a logic circuit, said logic circuit having a reference ground potential, comprising:
   a MOS transistor having a gate coupled to a power supply, a source receiving an external reset input signal, and a drain, said drain having a high potential when the external reset input signal is high and the voltage of said power supply drops below a predetermined threshold;
   a flip-flop having a set input connected to the drain of said MOS transistor, said flip-flop being set to produce an internal reset signal when the drain of said MOS transistor is high and being reset when the external reset input signal is low;
   means for producing a reset output from said flip-flop when said flip-flop is in the set state; and
   means for applying said reset output to said logic circuit.

2. A reset circuit according to claim 1, wherein the drain of said MOS transistor is connected through a resistor to reference ground potential.

3. A reset circuit according to claim 2, further comprising a second MOS transistor interposed between the drain of said first-mentioned MOS transistor and the set input of said flip-flop, said second MOS transistor being turned on when the drain of said first-mentioned MOS transistor is high, whereby said flip-flop is set when said second MOS transistor is on.

4. A reset circuit according to claim 1, further comprising an inverter receiving said external reset input signal and generating at the output thereof a reset release signal, said reset release signal being applied to said logic circuit.

5. A reset circuit according to claim 4, further comprising a second MOS transistor connected to the output of said inverter, said second MOS transistor being turned on when the reset release signal of said inverter is high, whereby said flip-flop is reset when said second MOS transistor is on.

6. A reset circuit according to claim 1, further comprising means for making the external reset input signal low when the logic circuit does not produce a signal for a predetermined period, said signal being an indication that the logic circuit is operating normally.

7. A reset circuit according to claim 1, further comprising means for making the reset input low at a predetermined time interval.

8. A reset circuit according to claim 1, wherein when the difference between the potentials applied to the gate and source of said first-mentioned MOS transistor is greater than the threshold voltage thereof, said first-mentioned MOS transistor becomes conductive.

9. A reset circuit according to claim 1, wherein said external reset input signal is the power supply for said flip-flop.

10. A reset circuit according to claim 9, wherein said flip-flop is connected between said external reset input signal and said reference ground potential.

11. A reset circuit according to claim 3, wherein said flip-flop has its set input coupled to the drain of said second MOS transistor.

12. A reset circuit according to claim 3, further comprising a third MOS transistor having its drain coupled to a reset input of said flop-flop and having its source coupled to said reference ground potential, the gate of said third transistor receiving a reset release signal.

13. A reset circuit according to claim 12, wherein said first-mentioned MOS transistor is a PMOS transistor, and said second and third MOS transistors are NMOS transistors.

14. A reset circuit according to claim 12, further comprising an inverter coupled to receive said external reset input signal and generate said reset release signal.

15. A reset circuit according to claim 12, wherein said means producing a reset output comprises an OR gate receiving said reset release signal and said internal reset signal, said reset output being produced at the output of said OR gate.

16. A reset circuit according to claim 1, wherein said logic circuit comprises a microcomputer.

* * * * *